(12) United States Patent
Caroff et al.

(10) Patent No.: US 9,541,455 B2
(45) Date of Patent: Jan. 10, 2017

(54) DEVICE FOR LOCALIZING HOT SPOTS WITH HEAT FLOW METERS

(75) Inventors: Tristan Caroff, Gieres (FR); Vincent Remondière, Grenoble (FR)

(73) Assignee: COMMISSARIAT À L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 222 days.

(21) Appl. No.: 14/235,224

(22) PCT Filed: Jul. 27, 2012

(86) PCT No.: PCT/FR2012/000316
§ 371 (c)(1),
(2), (4) Date: Jan. 27, 2014

(87) PCT Pub. No.: WO2013/017748
PCT Pub. Date: Feb. 7, 2013

(65) Prior Publication Data
US 2014/0192835 A1 Jul. 10, 2014

(30) Foreign Application Priority Data

Aug. 1, 2011 (FR) ..................................... 11 02407

(51) Int. Cl.
*G01K 1/14* (2006.01)
*H01L 23/34* (2006.01)
*H01L 23/38* (2006.01)

(52) U.S. Cl.
CPC ............... *G01K 1/143* (2013.01); *H01L 23/34* (2013.01); *H01L 23/38* (2013.01); *H01L 2924/0002* (2013.01)

(58) Field of Classification Search
CPC ...... G01K 1/143; H01L 23/00; H01L 2934/00
See application file for complete search history.

(56) References Cited

U.S. PATENT DOCUMENTS

| 5,946,181 | A | * | 8/1999 | Gibson | ............... H01L 27/0248 323/907 |
| 7,205,675 | B2 | * | 4/2007 | McKinnell | ............... G11B 9/10 257/930 |
| 7,321,833 | B2 | * | 1/2008 | DuHack | .................. G01F 1/696 702/45 |

(Continued)

FOREIGN PATENT DOCUMENTS

| DE | 101 32 763 A1 | 1/2003 |
| EP | 1 443 568 A2 | 8/2004 |

OTHER PUBLICATIONS

Dec. 7, 2012 International Search Report issued in International Application No. PCT/FR2012/000316.

(Continued)

*Primary Examiner* — Lisa Caputo
*Assistant Examiner* — Tran M Tran
(74) *Attorney, Agent, or Firm* — Oliff PLC (57) ABSTRACT

The electronic device comprises a substrate provided with a surface comprising a region of interest, the thermal behavior of which is to be monitored, and a system for detecting hot spots located in the region of interest. The system for detecting hot spots comprises at least three separate heat flow meters arranged on the surface of the substrate outside of the region of interest.

13 Claims, 5 Drawing Sheets

(56) References Cited

U.S. PATENT DOCUMENTS

| | | | | |
|---|---|---|---|---|
| 7,360,416 B2* | 4/2008 | Manaka | ............... | G01F 1/684 |
| | | | | 73/204.26 |
| 8,028,531 B2* | 10/2011 | Phan | ............... | H01L 23/34 |
| | | | | 62/259.2 |
| 8,168,879 B2* | 5/2012 | Chen | ............... | H01L 35/00 |
| | | | | 136/206 |
| 8,943,887 B2* | 2/2015 | Gerhardt | ............... | G01F 1/6845 |
| | | | | 73/204.11 |
| 8,962,970 B2* | 2/2015 | Mingo Bisquert | ..... | H01L 35/34 |
| | | | | 136/201 |
| 9,099,942 B2* | 8/2015 | Simon | ............... | H01L 35/30 |
| 2003/0034556 A1 | 2/2003 | Voigtlaender et al. | | |
| 2007/0296071 A1 | 12/2007 | Chiu et al. | | |
| 2009/0288425 A1 | 11/2009 | Phan et al. | | |
| 2009/0312887 A1 | 12/2009 | Barry et al. | | |
| 2012/0304746 A1* | 12/2012 | Gerhardt | ............... | G01F 1/6845 |
| | | | | 73/61.57 |

OTHER PUBLICATIONS

Mar. 22, 2012 French Search Report issued in French Application No. 1102407 (with English-language translation).

* cited by examiner

DEVICE FOR LOCALIZING HOT SPOTS WITH HEAT FLOW METERS

BACKGROUND OF THE INVENTION

The invention relates to a device comprising a region of interest arranged on a surface of a substrate and a system for detecting hot spots located in said region of interest.

STATE OF THE ART

As the integration density increases, the electric power dissipated within electronic devices never stops growing. The increase of the dissipated electric power may generate a so-called self-heating phenomenon. Such a phenomenon may cause the degradation of certain physical and electrical characteristics of electronic devices.

Currently, electronic circuits comprise more and more thermal power management systems. When the temperature within the electronic circuit exceeds a given threshold, the thermal power management system may for example start a fan or suspend the activity of certain components or secondary circuits. The efficiency of this type of system depends on the information collected by a temperature sensor, relative to the heating condition of the electronic circuit. The temperature sensor is generally placed close to the electronic circuit and is connected to the thermal power management system.

For an optimum efficiency, the temperature sensor is arranged as closely as possible to the critical components capable of undergoing an overheating. Thus, the temperature sensor is generally invasive, that is, it is formed within the surveyed area which comprises the critical electronic components. Integration rules then become more and more constraining. In particular, in the case of a diode-type temperature sensor, the current flow in the diode may disturb the operation of the surveyed electronic component.

US patent application 2007/0296071 describes an encapsulation package provided with temperature sensors intended to detect a hot spot in an encapsulated electronic circuit. Generally, encapsulation packages are formed in a substrate different from the substrate comprising the electronic circuit. Accordingly, this type of temperature sensors is formed according to specific methods, which further complicates their manufacturing. Further, the temperature sensors, in this patent application, are placed under the electronic circuit. Such an arrangement of the temperature sensors is difficult to achieve since it depends on several factors, such as the available surface area of the package substrate and the layout of the electric connections connecting the temperature sensors and the thermal power management circuit. Further, such a device has a very small observation area, and it is incapable of detecting a difficult-to-access hot spot. Further, US patent application 2009/288425 discloses a device for regulating the thermal behavior of an integrated circuit on occurrence of hot spots. The integrated circuit to be monitored is formed on a first substrate while the thermal regulation device is formed on a second substrate placed on the rear surface of the first substrate. The regulation device comprises a plurality of thermoelectric devices distributed in the second substrate to form a grid. Each thermoelectric device comprises a thermistor to evaluate the temperature in a portion of the integrated circuit arranged in the first substrate. The forming of this type of heat regulation device then becomes complicated.

US patent application 2009/312887 describes a device for thermally stabilizing an electronic component assembled on a PCB substrate. The thermal stabilization device comprises an array of heat-sensitive devices, an array of thermoelectric devices, and a controller of MIMO (Multiple-Input, Multiple-Output) type. A heat-conducting paste is interposed between said electronic component and the PCB substrate. Further, the thermal stabilization device comprises a thermoelectric device arranged above the electronic component.

SUMMARY OF THE INVENTION

In certain applications using electronic devices formed with a high integration density on a substrate surface, a non-invasive, reliable, and easy-to-form system, enabling to locate and to quantify the temperature of a hot spot which appears in this surface of the substrate, is thus needed.

This need tends to be satisfied by providing an electronic device comprising a substrate provided with a surface which comprises a region of interest, the thermal behavior of which is to be monitored, and a system for detecting hot spots located in said region of interest. The detection system comprises a calculation unit and at least three separate heat flow meters arranged on the substrate surface outside of the region of interest.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PARTICULAR EMBODIMENTS

A practical and reliable way to detect hot spots in a region of interest of a substrate surface comprises using a system based on heat flow meters. More specifically, the hot spot detection system is a non-invasive system which comprises heat flow meters arranged outside of the region of interest having a thermal behavior to be monitored.

Figure 1:
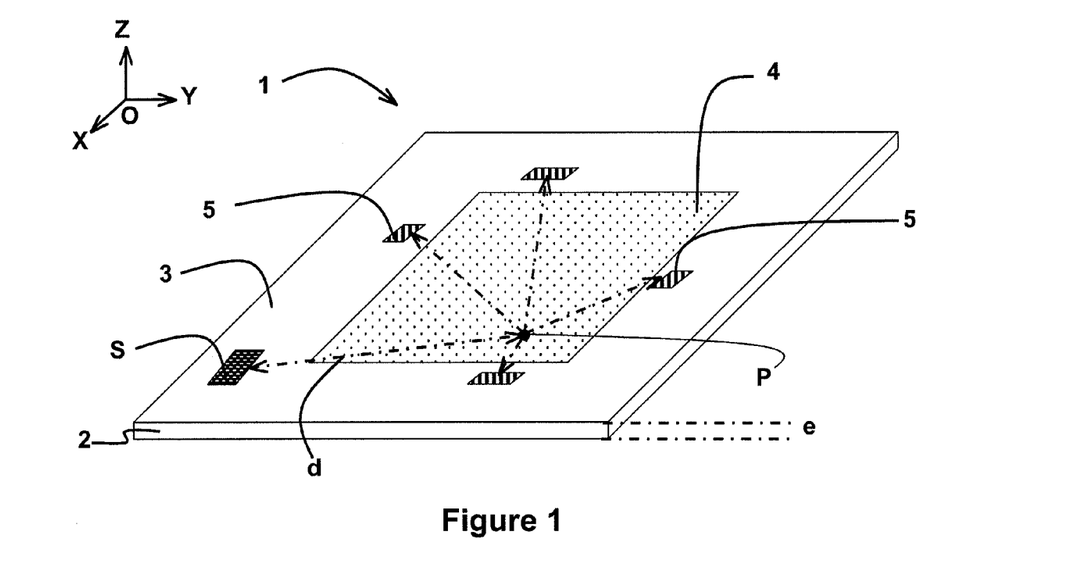
FIG. 1 schematically shows in perspective view an electronic device according to a first specific embodiment of the invention.

According to a specific embodiment, electronic device 1 is shown in FIG. 1. Electronic device 1 comprises a substrate 2, preferably having a thickness e. Substrate 2 is provided with a surface 3, preferably substantially planar, and comprising a region of interest 4 having a thermal behavior to be monitored.

Region of interest 4 of substrate 2 may for example comprise one or several active or passive components formed on the front surface of substrate 2, that is, on surface 3. These components, by dissipating a given electric power, may cause a temperature rise in the region of interest, thus creating a hot spot. "Monitoring" means detecting possible thermal anomalies, and more particularly hot spots which may appear. To achieve this, electronic device 1 comprises a system for detecting hot spots located in region of interest 4.

The hot spot detection system comprises at least three different heat flow meters 5 arranged on surface 3 of substrate 2, outside of region of interest 4. "Heat flow meter" designates a device sensitive to a temperature gradient, and intended to measure values representative of a heat flow generated by this temperature gradient. Due to heat flow meters 5, it is possible to determine the location of a hot spot P in region of interest 4 or also the thermal power and the temperature of said hot spot P.

The heat flow generated by a hot spot P is propagated in substrate 2, and it reaches the different heat flow meters 5 located at various distances from hot spot P. Each heat flow meter 5 generates a response, preferably electrical, to the heat flow reaching it, which especially depends on the distance separating it from hot spot P.

By previously calibrating heat flow meters 5 and by using their response, it is possible to locate one or several hot spots capable of occurring in region of interest 4. Indeed, by means of simple mathematical algorithms, for example, those using triangulation, the hot spots in region of interest 4 may be located by exploiting the responses of heat flow meters 5. Accordingly, the detection system advantageously comprises a calculation unit programmed to analyze the values of the different heat flow meters to determine, preferably by triangulation, the location, the thermal power, and the temperature of a hot spot of region of interest 4. Preferably, region of interest 4, heat flow meters 5 and the calculation unit are formed on surface 3 of substrate 2. Such a configuration advantageously enables to avoid alignment issues. Indeed, and as an example, alignment issues may arise when elements of the detection system and of the region of interest are formed on two different bonded substrates. Further, an attachment of these two substrates together may cause a reliability issue due to the behavior of the bonding along time, thus causing a degradation of the thermal performance of the device.

As indicated hereabove, the hot spot detection system can determine the thermal power of hot spot P. The notion of thermal power is intimately connected to the heat flow. Indeed, the thermal power through a given isothermal surface is, by definition, the sum of the heat flow density through said isothermal surface. Thereby, the thermal power of hot spot P, dissipated within region of interest 4, may be determined by correlation with the sum of the responses originating from heat flow meters 5 according to relation:

$$\Phi = k \times \sum_{1}^{N} \Delta V.$$

With $\Phi$ being the thermal power dissipated in region of interest 4, N the number of heat flow meters 5, $\Delta V$ the response of each heat flow meter 5 and k a constant determined according to the placing of heat flow meters 5 with respect to region of interest 4 and according to the physical properties of heat flow meters 5. Constant k may be determined by calculation or by calibration.

The temperature of hot spot P of region of interest 4 may be determined by using a reference temperature sensor S placed at the level of substrate 2 outside of region of interest 4 in order not to be invasive. For example, the temperature of hot spot P may be calculated by combining, particularly, the temperature values measured by said reference temperature sensor S, thermal power $\Phi$ of the hot spot determined from heat flow meters 5, distance d separating reference temperature sensor S from hot spot P. Temperature $T_C$ of hot spot P may be determined, for example, by the following relation: $T_C = T_{ref} + \Phi \times R_{SP}$. With $R_{SP}$ being the thermal resistance of the substrate portion separating hot spot P from reference temperature sensor S.

The hot spot detection system of device 1 may use heat flow meters of any known type. As an example, a heat flow meter 5 may comprise first and second adjacent temperature sensors, arranged on a substrate, for example, substrate 2, having a known thermal resistance $R_{th-s}$. Such an arrangement enables to determine the heat flow crossing said substrate between the two temperature sensors. Indeed, heat flow $\phi$ may be determined by the following relation:

$$\phi = (T_{S1} - T_{S2}) \times R_{th-s} \tag{1}$$

With $T_{S1}$ and $T_{S2}$ being the temperatures measured by, respectively, the first and second temperature sensors. However, this type of heat flow meter requires a complex connection system.

To ease connections and the response processing by the programmed calculation unit, heat flow meters 5 are preferably thermoelectric flow meters which enable to convert a thermal energy into electric energy due to the "Seebeck" effect. Heat flow meters 5 may for example comprise planar thermocouples. "Planar thermocouple" means a thermocouple comprising legs formed parallel to the plane of a substrate. This substrate is preferably substrate 2 supporting region of interest 4. The heat flow to be detected displaces in the plane of substrate 2 comprising the thermocouples, and it quasi-exclusively propagates throughout substrate 2. Thereby, to optimize and calibrate this type of heat flow meters, the thermal resistances and capacitances to be taken into account mainly are those of substrate 2.

Figure 2:
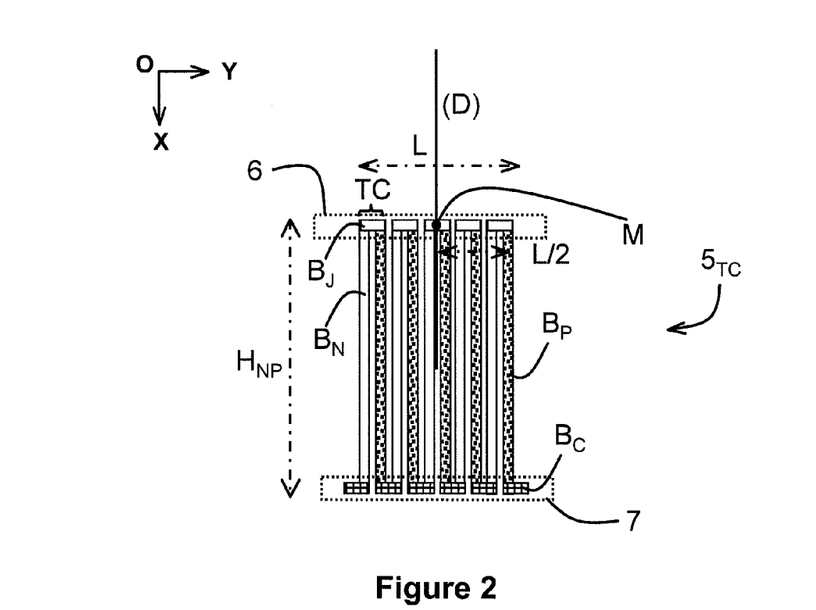
FIG. 2 schematically shows in top view an example of a heat flow meter used by the electronic device of FIG. 1.

An example of a thermoelectric flow meter $5_{TC}$ is shown in FIG. 2. Heat flow meter $5_{TC}$ may comprise m thermocouples TC, m being the largest possible integer. To improve the sensitivity of the thermoelectric flow meter, number m of thermocouples is limited by the available surface area and by the resolution of the technology used for their manufacturing. Currently, thermoelectric flow meters comprising from 6 to 20 legs having a length in the range from 20 to 40 µm and a thickness smaller than 100 nm can commonly be found. In the case shown in FIG. 2, heat flow meter $5_{TC}$ comprises 5 thermocouples TC which may be aligned next to one another, to be electrically series-connected via interconnect $B_C$. Generally, thermoelectric flow meters comprise several electrically series-connected thermocouples, thermally arranged in parallel with respect to the heat flow to be detected, to obtain an efficient electrical response from the heat flow meter. Each thermocouple TC is preferably U-shaped and it comprises two substantially parallel legs $B_N$ and $B_P$. In other words, it is preferable for each heat flow meter $5_{TC}$ of the hot spot detection system to comprise at least one thermocouple TC provided with two legs $B_N$ and $B_P$ made of thermoelectric materials.

Legs $B_N$ and $B_P$ of a given thermocouple TC are interconnected at the level of one of their ends by an element $B_J$, to form a thermoelectric junction. In other words, thermoelectric flow meter $5_{TC}$ comprises m legs $B_N$ and m legs $B_P$, substantially parallel and arranged in alternation: one leg $B_N$ next to one leg $B_P$. Legs $B_N$ and $B_P$ have a height $H_{NP}$. Legs $B_N$ and $B_P$ are also interconnected via element $B_C$ to electrically connect two adjacent thermocouples TC.

Legs $B_N$ and $B_P$ are formed with materials having different thermoelectric natures, that is, materials capable of generating the Seebeck effect. Preferably, legs $B_N$ and $B_P$ are respectively N- and P-doped. Indeed, the association of two different N- and P-doped thermoelectric materials enables to increase the differential Seebeck coefficient between the two materials. Thus, the sensitivity of thermocouple TC is improved.

Legs $B_N$ and $B_P$ may be formed by any known method, for example, by means of a printing method such as inkjet or silk screening which has an advantage in terms of manufacturing costs. Thermocouples TC may also be formed by a thin-film deposition method used in microelectronics, such as chemical vapor deposition, noted CVD, or physical vapor deposition, noted PVD. As an example, an ion implantation step may also be used after the deposition step, to dope legs $B_N$ and $B_P$ in order to improve the sensitivity to a temperature gradient of thermocouple TC.

In operation, heat flow meter $5_{TC}$ is arranged in a temperature gradient. Preferably, one end of thermocouples TC is located on a first side 6, or "hot side", arranged close to a first source, for example, a heat source, and the other end of thermocouples TC is thereby located on a second side 7, or "cold side", distant from the heat source. In the present case, the heat source is formed by the hot spots of region of interest 4. Thus, to increase the sensitivity of heat flow meter $5_{TC}$, it is preferably for "hot side" 6 to be arranged as closely as possible to region of interest 4 having a thermal behavior to be monitored. For heat flow meter $5_{TC}$ of FIG. 2, element $B_J$ forms "hot side" 6 and $B_C$ forms "cold side" 7. Preferably, legs $B_N$ and $B_P$ of thermocouple TC have first and second ends. The first end is proximal to region of interest 4. The second end of legs $B_N$ and $B_P$ is distal to region of interest 4.

Figure 3:
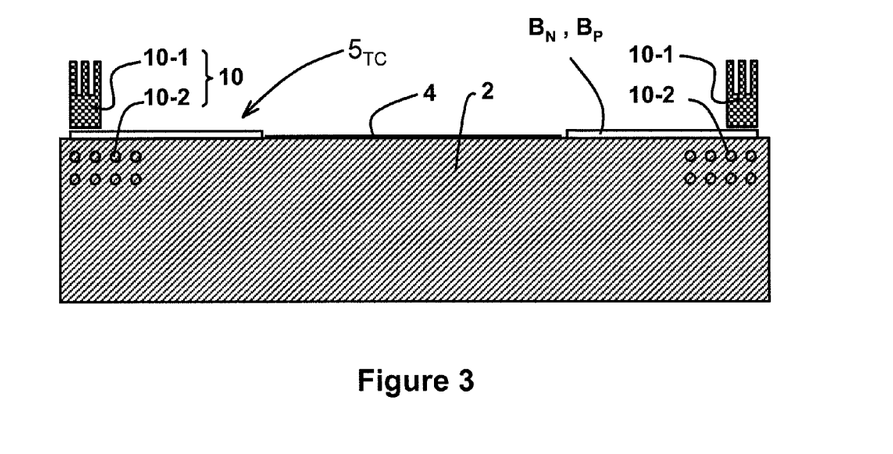
FIG. 3 schematically shows in cross-section view a specific embodiment of the invention using cooling means.

According to an embodiment illustrated in FIG. 3, cooling means 10 are associated with heat flow meter $5_{TC}$ of the same type as that shown in FIG. 2. Cooling means 10 are arranged at the second end of legs $B_N$ and $B_P$. Cooling means 10 may comprise miniature radiators 10-1 and/or micro heat pipes 10-2 intended to convey a cooling fluid. Miniatures radiators 10-1 are preferably arranged on the end of legs $B_N$ and $B_P$ at their second end. Micro heat pipes 10-2 may be formed in substrate 2. Preferably, micro heat pipes 10-2 are formed under the second end of legs $B_N$ and $B_P$. The cooling means enable to decrease the temperature of the end of thermocouples TC located at the second end distal to region of interest 4. Thereby, the cooling means advantageously enable to increase the temperature difference between the first end and the second end of legs $B_N$ and $B_P$ and thus to improve the sensitivity of thermoelectric flow meter $5_{TC}$.

Figure 4:
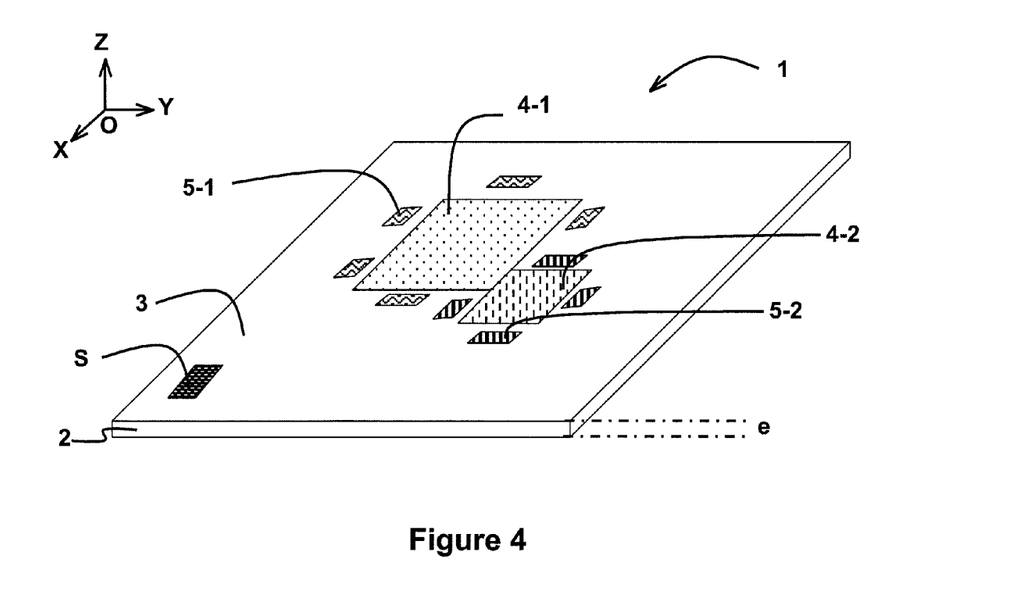
FIGS. 4 to 7 schematically show in perspective view an electronic device according to other specific embodiments of the invention.

According to an alternative embodiment shown in FIG. 4, region of interest 4 comprises a first region 4-1 and a second region 4-2. As shown in FIG. 4, a first set of at least three heat flow meters 5-1 is arranged on surface 3 of substrate 2 outside of first region 4-1 to detect hot spots in first region 4-1. A second set of at least three heat flow meters 5-2 is also arranged on surface 3 of substrate 2 outside of second region 4-2 to detect hot spots in second region 4-2. The system of hot spot detection in region of interest 4 comprises, according to this alternative embodiment, the first and second sets of heat flow meters 5-1 and 5-2. Such an arrangement of heat flow meters 5-1 and 5-2 advantageously enables to distribute heat flow meters 5-1 and 5-2 to better cover region of interest 4 according to its geometric shape.

Figure 5:
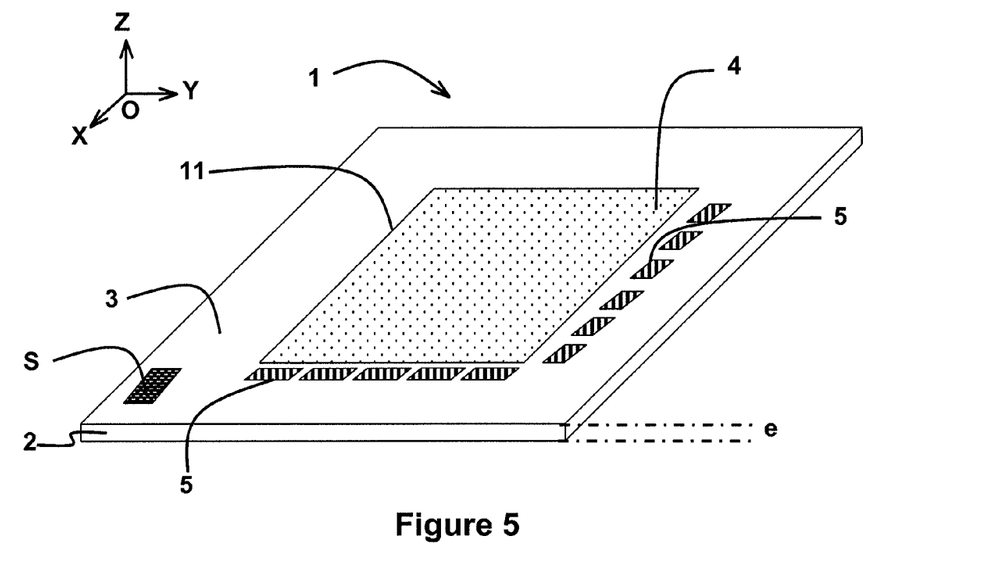

According to a specific embodiment illustrated in FIG. 5, region of interest 4 has a rectangular shape 11 and heat flow meters 5 are arranged along one side of rectangle 11. Preferably, heat flow meters 5 are staggered along at least two perpendicular sides of rectangle 11. In other words, heat flow meters 5 are distributed along two perpendicular axes forming two adjacent sides of a rectangle containing region of interest 4. To ease connections and their forming, heat flow meters 5 may be interconnected. In this case, heat flow meters 5 deliver differential responses which will then be transmitted to the calculation unit of the hot spot detection system. The spatial resolution of the hot spot detection system increases along with the increase of the number of heat flow meters 5 arranged along one side of rectangle 11.

Figure 6:
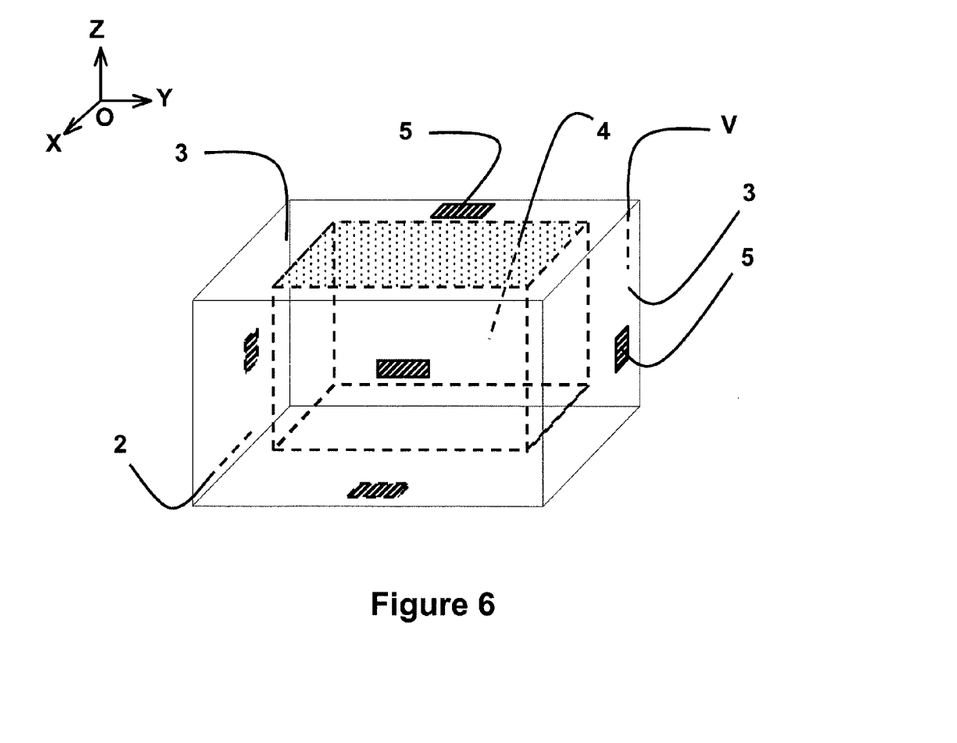

According to a specific embodiment shown in FIG. 6, surface 3 is a closed surface comprising a volume V of substrate 2. Region of interest 4 is a volume comprised within volume V. At least three heat flow meters 5 are arranged on surface 3 outside of region of interest 4. Region of interest 4 may comprise devices and/or three-dimensional assemblies of electronic circuits. Such electronic circuits are preferably stacked and connected by vias, and they may be formed according to the so-called "3D-IC" technology. Such a technology is more and more commonly used since it provides a very high degree of integration. However, such a technology suffers from self-heating problems. The arrangement of heat flow meters 5 advantageously allows a thermal management of region of interest 4 without needing to integrate temperature sensors within the volume of region of interest 4. Said thermal management is carried out by determining the location, the thermal power, or also the temperature of a hot spot of region of interest 4.

Figure 7:
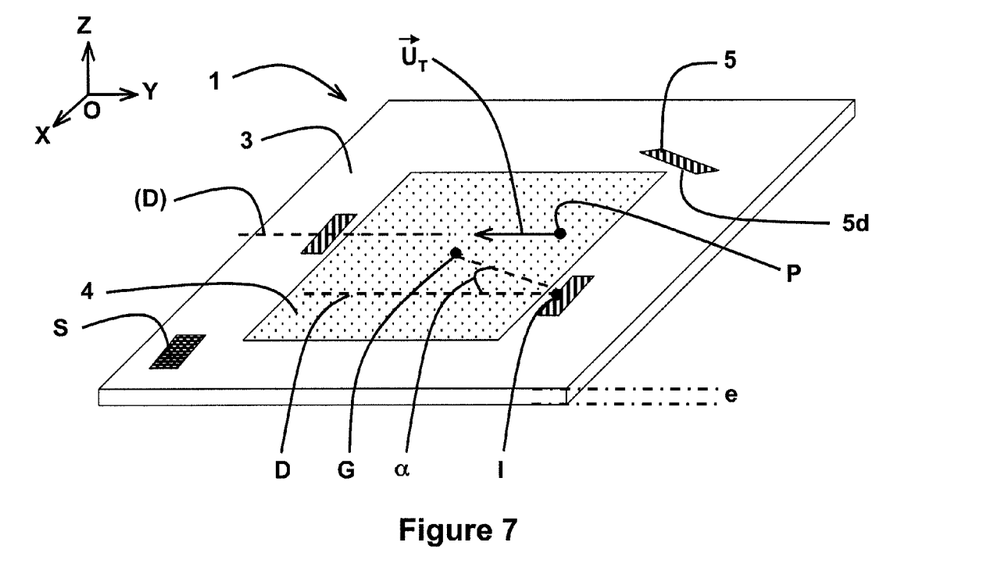

According to a specific embodiment shown in FIG. 7, each heat flow meter 5 comprises a detection surface $5d$, advantageously directed towards center of gravity G of region of interest 4. In other words, each heat flow meter 5 comprises a detection axis D, preferably perpendicular to detection surface $5d$, and having its direction angle $\alpha$, relative to a straight line crossing center of gravity G of region of interest 4 and heat flow meter 5, in the range between $-\pi/4$ and $\pi/4$, inclusive. "Detection axis" D of a heat flow meter 5 designates the straight line with which the direction of heat wave vector $\vec{U}_T$ of a hot spot P should advantageously be confounded to obtain the best accuracies and sensitivities of detection of hot spot P by heat flow meter 5.

As an example, a heat flow meter $5_{TC}$ of the same type as that shown in FIG. 2 may be used in the embodiment illustrated in FIG. 7. It then comprises identical thermocouples TC, staggered along a length L and separated from each other by a constant distance. Detection axis D of heat flow meter 5 is the straight line parallel to legs $B_N$ and $B_P$ and running through middle M of heat flow meter 5. "Middle of heat flow meter" 5 means point M located at a distance of approximately L/2 from the two thermocouples located, along axis (oy), at the ends of heat flow meter 5. Thus, the above-defined detection surface actually corresponds to hot side 6 of FIG. 2.

Direction angle $\alpha$ is the acute angle formed by detection axis D and the straight line crossing center of gravity G of region of interest 4 and heat flow meter 5, detection axis D further joining the associated heat flow meter at an intersection point I. The fact of having a direction angle $\alpha$ between $-\pi/4$ and $\pi/4$ for all heat flow meters 5 advantageously enables to increase the number of heat flow meters 5 which are efficiently directed towards a given hot spot of region of interest 4. In this case, the responses of heat flow meters 5 are more accurate and sensitive. A better accuracy and sensitivity enable to improve the accuracy of the locating of a hot spot P in region of interest 4.

Figure 8:
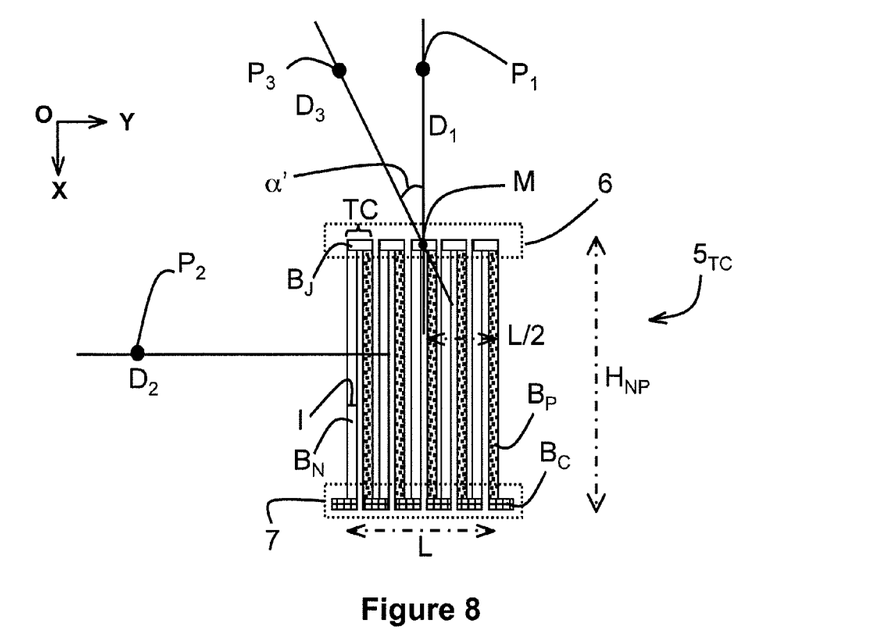
FIG. 8 schematically shows in top view three different hot spots located in the vicinity of the heat flow meter of FIG. 2.

As an example illustrated in FIG. 8, three hot spots $P_1$, $P_2$, and $P_3$ are placed in different positions with respect to heat flow meter $5_{TC}$ shown in FIG. 2, where the same reference numerals designate the same objects. Generally, the legs forming a thermocouple have a width I, typically in the order of a few μm, small enough with respect to their height $H_{NP}$, typically in the order of tens, or even hundreds, of μm.

Hot spot $P_1$ is placed on detection axis $D_1$. Thus, all the thermocouple ends arranged on "hot side" 6 are located on the same isothermal profiles generated by hot spot $P_1$. Thereby, almost all thermocouples generate substantially the same electric signal as a response to the heat flow generated by hot spot $P_1$. The sensitivities and accuracies of thermoelectric flow meter 5 are then improved.

Hot spot $P_2$ is placed on an axis $D_2$ crossing heat flow meter 5. Axis $D_2$ is also perpendicular to legs $B_N$ and $B_P$. The ends of legs $B_N$ and $B_P$ are then located on the same isothermal profiles generated by hot spot $P_2$. Thus, almost all thermocouples TC generate substantially a same electric signal close to zero as a response to the heat flow generated by hot spot $P_2$.

Hot spot $P_3$ is placed on an axis $D_3$ crossing heat flow meter 5. Axis $D_3$ forms with axis $D_1$ an acute angle α'. Thus, all the thermocouple ends arranged on "hot side" 6 may be located on slightly different isothermal profiles generated by hot spot $P_3$. Height $H_{NP}$ of thermocouple TC being large, the location of hot spot $P_3$ with respect to heat flow meter 5 may generate slight differences between the responses of thermocouples TC.

The above analysis of the location of the three hot spots $P_1$, $P_2$ and $P_3$ shows that there is a need to adapt the direction of heat flow meters 5 to improve the detection of hot spots. This need can be satisfied by an alternative embodiment where the hot spot detection system comprises means for rotating heat flow meters 5 to adjust direction angle α of detection axis D.

Each heat flow meter 5 may for example be provided with an electromechanical system intended to impose to the associated heat flow meter 5 a rotating motion to enable the detection surface of the heat flow meter to scan the surface of substrate 2 at the level of region of interest 4. This rotating motion advantageously enables to pivot heat flow meters 5 around axis (oz) to better direct them towards a hot spot of region of interest 4. Said electromechanical systems advantageously interact with the mathematical algorithm of the calculation unit, which exploits the responses of the heat flow meters to find the rotation angle which enables to optimize the sensitivity and the accuracy of heat flow meters 5. Typically, it will be considered that, for a heat flow meter of the type in FIGS. 2 and 5, the detection axis runs through the hot spot when the voltage provided by the thermoelectric flow meter is maximum.

Figure 9:
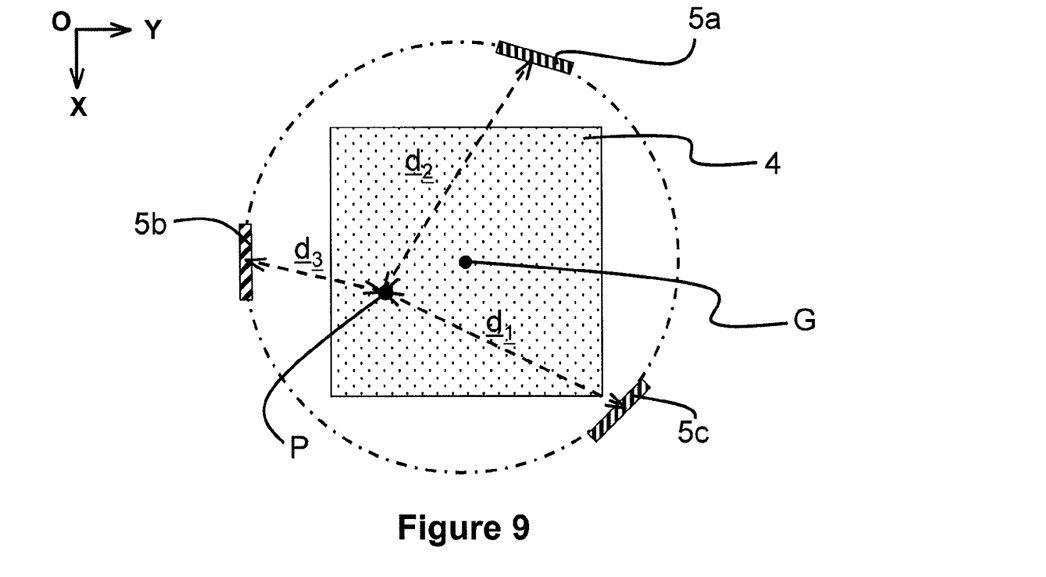
FIGS. 9 and 10 schematically show in top view an electronic device according to other specific embodiments of the invention.

According to a specific embodiment illustrated in FIG. 9, heat flow meters 5a, 5b, and 5c are advantageously located at substantially equal distances from center of gravity G of region of interest 4 having a thermal behavior to be monitored. In other words, heat flow meters 5 are substantially arranged on a circle having its center coinciding with center of gravity G of region of interest 4. Such an arrangement of heat flow meters 5 enables to decrease the difference between distances $d_1$, $d_2$ and $d_3$ separating any hot spot P of region of interest 4, respectively, from heat flow meters 5a, 5b, and 5c. Thereby, the response of each heat flow meter 5 may be exploited with similar degrees of accuracy and sensitivity. Thus, the mathematical algorithm used by the calculation unit of the hot spot detection system can exploit a maximum number of accurate responses of heat flow meters 5. A reliable calculation of the coordinates of a hot spot of region of interest 4 and of the thermal power of said hot spot is then performed.

Figure 10:
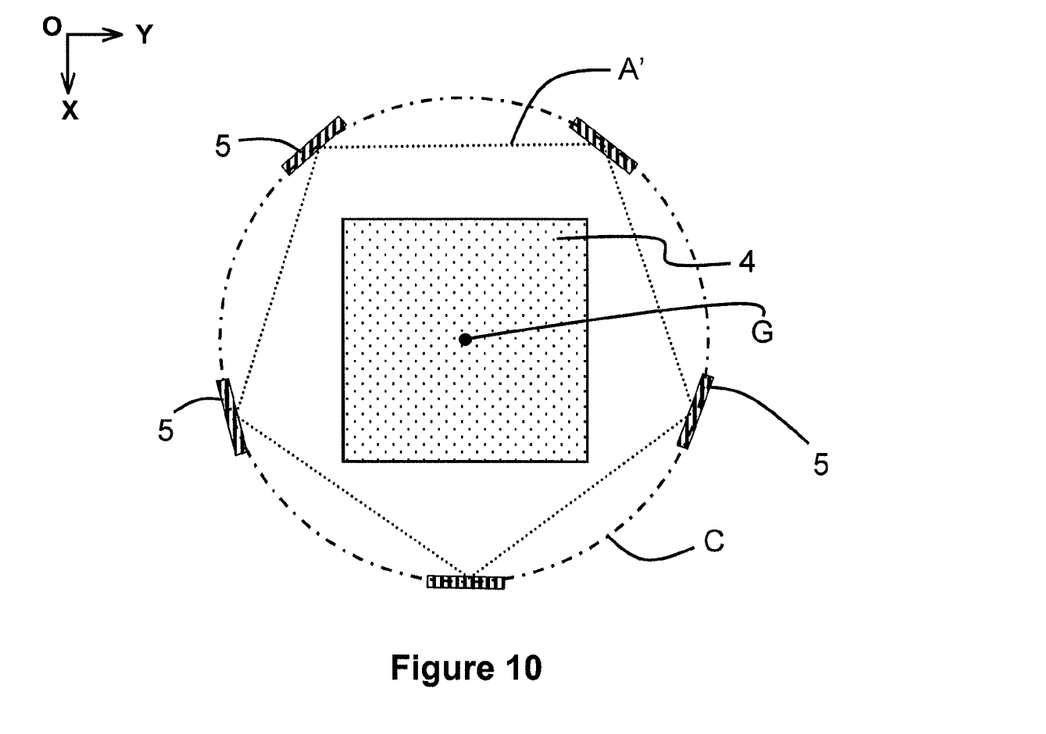

According to a specific embodiment illustrated in FIG. 10, five heat flow meters 5 are arranged in the form of a pentagon A' having its summits formed by the five heat flow meters 5. Pentagon A' is regular and can be inscribed within a circle C having its center coinciding with center of gravity G of region of interest 4. Such an arrangement enables to make the angles and the side lengths of pentagon A' uniform. Thus, and without this being a limitation, heat flow meters 5 are preferably arranged in the form of a regular polygon A' that can be inscribed within a circle C having its center coinciding with center of gravity G of region of interest 4. Each summit of said polygon A' is associated with a heat flow meter 5. Such an arrangement enables to maximize the angles between heat flow meters 5 and to uniformly distribute heat flow meters 5 on circle C. Thus, region of interest 4 is better covered according to this embodiment.

According to a specific embodiment where heat flow meters 5 are thermoelectric flow meters of the same type as that shown in FIG. 2. The detection system then comprises a system for acquiring electric signals of heat flow meters 5 having a measurement resolution $r_V$. Each heat flow meter 5 comprises a number m of thermocouples TC, each thermocouple TC being provided with two legs $B_N$ and $B_P$ made of thermoelectric material having a height $H_{NP}$.

In order for the hot spot detection system to operate optimally, it is preferably for heat flow meters $5_{TC}$ to deliver a sufficient electric signal greater than resolution $r_V$ of a system for acquiring the electric signals of thermoelectric flow meters $5_{TC}$ of the hot spot detection system in region of interest 4. Advantageously, the sensitivity of thermoelectric flow meters $5_{TC}$ is adjusted by taking into account electric resolution $r_V$, the size of region of interest 4 to be monitored, and minimum power $\Phi_{min}$ of a hot spot to be detected. Generally, electric resolution $r_V$ has a value in the order of 0.5 mV and minimum thermal power $\Phi_{min}$ to be detected is in the order of 10 mW.

In the forming of thermoelectric flow meters $5_{TC}$, height $H_{NP}$ and number m of thermocouples TC form parameters, influencing the sensitivity, which are easily adjustable. Advantageously, these parameters will be taken into account to adjust the sensitivity of thermoelectric flow meters $5_{TC}$. Height $H_{NP}$ of legs $B_N$ and $B_P$ of thermocouples TC is advantageously defined by formula:

$$H_{NP} \geq R \times \left( \exp\left( \frac{r_V \times 2\pi \times \lambda_{sub} \times e}{m \times S_{np} \times \Phi_{min}} \right) - 1 \right) \tag{1}$$

with R being the radius of the circle circumscribed within region of interest 4, $S_{np}$ the differential Seebeck coefficient of the thermoelectric materials of said legs $B_N$ and $B_P$, $\lambda_{sub}$ the heat conductivity of substrate 2, e the thickness of said substrate 2, and $\Phi_{min}$ the minimum thermal power to be detected, dissipated by a hot spot in region of interest 4. In such conditions, power Φ dissipated by a hot spot can be deduced by formula $$\Phi = k \times \sum_{1}^{N} \Delta V.$$

With $\Phi$ being the thermal power dissipated in region of interest 4, N the number of heat flow meters $5_{TC}$, $\Delta V$ the response of each heat flow meter $5_{TC}$, and k a constant defined by formula:

$$k = \frac{2\pi \times \lambda_{sub} \times e}{N \times m \times S_{np} \times \ln(1 + H_{np}/R)} \quad (2)$$

According to an alternative embodiment, the adjustment of height $H_{NP}$ of legs $B_N$ and $B_P$ may also depend on direction angle $\alpha$ of thermoelectric flow meter $5_{TC}$. Advantageously, for a thermoelectric flow meter $5_{TC}$ having a detection axis D with a direction angle $\alpha$ relative to a straight line running through center of gravity G of region of interest 4 and thermoelectric flow meter $5_{TC}$ in the range between $-\pi/4$ and $\pi/4$, inclusive, height $H_{NP}^{\alpha}$ of legs $B_N$, $B_P$ of thermocouples TC of thermoelectric flow meter $5_{TC}$ is defined by formula:

$$H_{NP}^{\alpha} \geq \frac{R}{\cos(\alpha)} \times \left( \exp\left( \frac{r_V \times 2\pi \times \lambda_{sub} \times e}{n \times S_{np} \times \Phi} \right) - 1 \right) \quad (3)$$

The variables used are the same as defined hereabove.

The invention claimed is:

1. An electronic device comprising:
   a substrate provided with a surface and at least an active or a passive electronic component arranged in a region of interest comprised in the surface,
   a detection system configured to detect hot spots located in the region of interest, the detection system comprising:
   at least three separate heat flow meters arranged on the surface of the substrate outside of the region of interest, each heat flow meters being sensitive to a temperature gradient and configured to measure values representative of a heat flow generated by a hot spot in the region of interest; and
   a calculation unit configured to analyze the values of the different heat flow meters, and to determine the location of a hot spot in the region of interest,
   wherein the detection system comprises a system for acquiring electric signals from the heat flow meters with a measurement resolution $r_V$, each heat flow meter comprising a number m of thermocouples, each thermocouple being provided with two legs made of thermoelectric materials having their height $H_{NP}$ defined by formula:

$$H_{NP} \geq R \times \left( \exp\left( \frac{r_V \times 2\pi \times \lambda_{sub} \times e}{m \times S_{np} \times \Phi_{min}} \right) - 1 \right)$$

with R being the radius of the circle circumscribed in the region of interest, $S_{np}$ the differential Seebeck coefficient of the thermoelectric materials of the legs, $\lambda_{sub}$ the heat conductivity of the substrate, e the thickness of the substrate, and $\Phi_{min}$ the minimum thermal power to be detected, dissipated by a hot spot in the region of interest.

2. The device according to claim 1, wherein the calculation unit determines the location of a hot spot in the region of interest by triangulation.

3. The device according to claim 1, wherein each thermocouple is planar and the two legs of each thermocouple are arranged parallel to the plane of the substrate.

4. The device according to claim 3, wherein the heat flow meters are configured to detect a heat flow displacing in the plane of the substrate having the thermocouples formed thereon.

5. The device according to claim 3, wherein the heat flow meter is arranged so that each thermocouple comprises a first end proximal to the region of interest, and a second end distal to the region of interest.

6. The device according to claim 1, wherein:
   each heat flow meter is provided with a detection axis defined as being the straight line with which the direction of the heat wave vector of a spot should be confounded to obtain the best accuracies and sensitivities of detection by the heat flow meter; and
   the detection axis has a direction angle $\alpha$ relative to a straight line running through the center of gravity of the region of interest and the heat flow meter in the range from $-\pi/4$ to $\pi/4$ radian, inclusive.

7. The device according to claim 6, wherein the detection system comprises electromechanical system configured to rotate the heat flow meters so as to adjust direction angle $\alpha$ of the detection axis.

8. The device according to claim 1, wherein the heat flow meters are located at substantially equal distances from the center of gravity of the region of interest.

9. The device according to claim 1, wherein the heat flow meters are arranged in the form of a polygon having each of its summits associated with a heat flow meter, the polygon being regular and likely to be inscribed within a circle having its center coinciding with the center of gravity of the region of interest.

10. The device according to claim 1, wherein the heat flow meters are distributed along two perpendicular axes forming two adjacent sides of a rectangle having the region of interest contained therein.

11. The device according to claim 3, wherein the legs of the thermocouple have first and second ends, the first end being proximal to the region of interest and the second end being distal to the region of interest, and wherein miniature radiators and/or micro heat pipes are arranged at the second end of the legs.

12. An electronic device comprising:
   a substrate provided with a surface and at least an active or a passive electronic component arranged in a region of interest comprised in the surface, the substrate being a homogenous substrate having a constant thickness; and
   a detection system configured to detect hot spots located in the region of interest, the detection system comprising:
   at least three separate heat flow meters arranged on the surface of the substrate outside of the region of interest, each of the at least three separate heat flow meters being sensitive to a temperature gradient and configured to measure values representative of a heat flow generated by a hot spot in the region of interest; and a calculation unit configured to analyze values of each of the at least three separate heat flow meters, and to determine the location of the hot spot in the region of interest, wherein the detection system comprises a system for acquiring electric signals from the heat flow meters with a measurement resolution $r_V$, each heat flow meter comprising a number m of thermocouples, each thermocouple being provided with two legs made of thermoelectric materials having their height $H_{NP}$ defined by formula:

$$H_{NP} \geq R \times \left( \exp\left( \frac{r_V \times 2\pi \times \lambda_{sub} \times e}{m \times S_{np} \times \Phi_{min}} \right) - 1 \right)$$

with R being the radius of the circle circumscribed in the region of interest, $S_{np}$ the differential Seebeck coefficient of the thermoelectric materials of the legs, $\lambda_{sub}$ the heat conductivity of the substrate, e the thickness of the substrate, and $\Phi_{min}$ the minimum thermal power to be detected, dissipated by a hot spot in the region of interest.

13. An electronic device comprising:
a substrate provided with a surface and at least an active or a passive electronic component arranged in a region of interest comprised in the surface,
a detection system configured to detect hot spots located in the region of interest, the detection system comprising:
at least three separate heat flow meters arranged on the surface of the substrate outside of the region of interest, each heat flow meters being sensitive to a temperature gradient and configured to measure values representative of a heat flow generated by a hot spot in the region of interest; and
a calculation unit configured to analyze the values of the different heat flow meters, and to determine the location of a hot spot in the region of interest, wherein each heat flow meter is provided with a detection axis defined as being the straight line with which the direction of the heat wave vector of a spot should be confounded to obtain the best accuracies and sensitivities of detection by the heat flow meter, the detection axis has a direction angle $\alpha$ relative to a straight line running through the center of gravity of the region of interest and the heat flow meter in the range from $-\pi/4$ to $\pi/4$ radian, inclusive, and the detection system comprises a system for acquiring electric signals from the heat flow meters with a measurement resolution $r_V$, each heat flow meter comprising a number m of thermocouples, each thermocouple being provided with two legs made of thermoelectric materials having their height $H_{NP}^\alpha$ defined by formula:

$$H_{NP}^\alpha \geq \frac{R}{\cos(\alpha)} \times \left( \exp\left( \frac{r_V \times 2\pi \times \lambda_{sub} \times e}{m \times S_{np} \times \Phi_{min}} \right) - 1 \right)$$

with R being the radius of the circle circumscribed in the region of interest, $S_{np}$ the differential Seebeck coefficient of the thermoelectric materials of the legs, $\lambda_{sub}$ the heat conductivity of the substrate, e the thickness of the substrate, and $\Phi_{min}$ the minimum thermal power to be detected, dissipated by the hot spot in the region of interest.

* * * * *